United States Patent [19]
Williams

[11] Patent Number: 5,345,406
[45] Date of Patent: Sep. 6, 1994

[54] BANDPASS SIGMA DELTA CONVERTER SUITABLE FOR MULTIPLE PROTOCOLS

[75] Inventor: Tim A. Williams, Danville, Calif.

[73] Assignee: Wireless Access, Inc., San Jose, Calif.

[21] Appl. No.: 935,018

[22] Filed: Aug. 25, 1992

[51] Int. Cl.$^5$ ............................................. G06F 15/31
[52] U.S. Cl. .................... 364/724.01; 341/143
[58] Field of Search .................... 364/724.01; 341/143

[56] References Cited

U.S. PATENT DOCUMENTS

| | | | |
|---|---|---|---|
| 4,857,928 | 8/1989 | Gailus et al. | 341/143 |
| 4,862,169 | 8/1989 | Van Bavel et al. | 341/143 |
| 4,914,651 | 4/1990 | Lusignan | 370/69.1 |

OTHER PUBLICATIONS

Wozencraft et al., "Principles of Communication Engineering", John Wiley and Sons, 1965, Chapter 4, pp. 211–285.
Anvari, K., et al., *Performance of a Direct Conversion Receiver with pi/4-dqpsk Modulated Signal*, Proceedings of the 41st IEEE Vehicular Technology Conference, May 1991, pp. 822–823.
Sevenhans, J., et al., *An Integrated Si Bipolar RF Transceiver for a zero IF 900 MHz GSM Digital Mobile Radio Frontend of a Hand Portable Phone*, IEEE 1991 Custom Integrated Circuits Conference, Paper 7.7.
Schreier, R., et al., *Decimation for Bandpass Sigma-Delta Analog-to-Digital Conversion*, IEEE 1990 Custom Integrated Circuits Conference, pp. 1801–1804.
Ping, L., pi Oversampling Analog/Digital Converters with Finite Zeros in Noise Shaping Functions, IEEE 1991 Custom Integrated Circuits Conference, pp. 1645–1648.
Tsurumi et al., *Design Study on a Direct Conversion Receiver Front-End for 280 MHZ, 900 MHZ, and 2.6 GHZ Band Radio Communication Systems*, IEEE 1991, pp. 457–462.
Jacobs et al., *Design Techniques for MOS Switched Ca-pacitor Ladder Filters*, IEEE Trans. Circuits Syst., vol. CAS-25, No. 12, pp. 159–165.
*Oversampling Delta-Sigma Data Converters*, IEEE Press, The Institute of Electrical and Electronics Engineers, Inc., New York, A Novel Architecture Design for VLSI Implementation of an FIR Decimation filter, by Hanafy Meleis, reprinted from IEEE Proc. ICASSP Mar. 1985, pp. 1380–1383.

*Primary Examiner*—Long T. Nguyen
*Attorney, Agent, or Firm*—Steven F. Caserza

[57] ABSTRACT

Improved integration and simplified construction of direct conversion receivers is achieved by providing selectivity in the early stages of a sigma delta converter to reject adjacent channel signals and thereby allow greater dynamic range for the desired input signals. A bandpass sigma delta converter is taught which is suitable for use with signals having multiple protocols. In a first stage, an aliased input signal is applied to two filters having desired and preferably programmable filter characteristics which provide selectivity to the input signal. A third filter is utilized having a programmable center frequency, which receives as an input signal the sum of the filtered input signal plus the quantization noise of the first stage. This provides a first intermediate output signal of desired selectivity. Quantization noise of the first stage is also applied to a second filter stage which provides a second intermediate output signal having a first component related to the quantization noise of the first stage, and a second component which is the shaped quantization noise of the second stage. The first and second intermediate output signals are combined in order to provide a desired output signal in which the original input signal has been filtered to provide a desired selectivity and converted to a digital signal while the quantization noise of the first stage has been cancelled, and the quantization noise of the second stage has been shaped by a desired function and converted to a digital signal independent of the input signal shaping.

16 Claims, 5 Drawing Sheets

BANDPASS SIGMA DELTA CONVERTER SUITABLE FOR MULTIPLE PROTOCOLS

BACKGROUND

Cellular telephones have undergone a dramatic market growth in the past few years. These existing systems utilize analog FM modulation techniques. In order to transmit dam, landline modem signals are transmitted over cellular systems by using the cellular telephone as a twisted pair replacement. The trend in the industry is toward replacing the analog FM system with digital modulation and transmission means, e.g. GSM, IS54, JDC. IS54 is a so-called dual mode system in which the existing analog and the new digital modulation have to coexist. Thus one portable handset will have to be capable of communicating using either the analog or the digital cellular signals. Other types of signals are being transmitted over the cellular network, as described in U.S. Pat. No. 4,914,651. This diversity of signals requires terminal equipment to include a receiver which is capable of dealing with multiple modulation techniques or "protocols."

FIG. 1 shows the spectrum of an aliased input signal X which is to be converted from an analog signal to a digital signal. Such an aliased input signal X includes a plurality of aliased copies of a signal of interest, and may be obtained, for example, from a sample and hold circuit, such as are known in the prior art or as is described in co-pending U.S. patent application Ser. No. 07/936,361 on an invention entitled "A Direct Conversion Receiver for Multiple Protocols". It is desired to select only that aliased copy which is centered around $\omega_0$ while rejecting the other aliased copies of the input signal. If a linear converter is utilized the quantization noise level $N_L(\omega)$ of the conversion is determined by the number of bits contained in the converter, as shown in FIG. 2. Using an oversampled converter allows for simpler construction of the converter as well as shaping of the quantization noise $N_3(\omega)$ (as also shown in FIG. 2) to allow for a higher precision conversion.

FIG. 3 shows a block diagram of a bandpass sigma delta converter as described in Ping, L., Dept. of Electrical and Electronics Engineering, University of Melbourne, Parkville, Victoria 3052, Austrailia, *IEEE*, pp. 1645-1648. As shown in Ping's equation (1), $$y(z) = \frac{a + bH(z)}{1 - H(z)} \times (z) + \frac{1}{1 - H(z)} n(z)$$

output signal Y is a function of the gains of the two input paths, a and b. If a and b are $-1$ and 1, respectively, the system equation reduces to Ping's equation (2), $$y(z) = -x(z) + \frac{1}{1 - H(z)} n(z)$$

which shows that input signal X is digitized without filtering and the quantization noise N(z) is shaped by the transfer function H1 of the bandpass sigma delta converter.

Ping also describes a cascaded system which is used to achieve higher orders of shaping of the input signal X, thereby shaping both the desired information signal and its associated noise.

One problem with such prior art techniques is the lack of selectivity of input signal X with respect to undesired adjacent channel signals. While the bulk of the selectivity may be performed in subsequent stages of an overall receiver design such as that shown in the above-mentioned co-pending U.S. patent application Ser. No. 07/936,361, and more specifically in the novel digital decimation filter described in co-pending U.S. patent application Ser. No. 07/934,746 on an invention entitled "A BandPass Decimation Filter Suitable for Multiple Protocols", the lack of selectivity of prior art bandpass sigma delta converters is undesirable and increases the difficulty of establishing appropriate gain levels within the sigma delta converter. While it is desirable to set the gain levels within the sigma delta converter to accommodate the largest expected signal, this is not adequately achieved in the prior art due to lack of selectivity with respect to adjacent channel signals. The nonselective nature of prior art designs prevents optimal signal to noise results for the conversion of the desired input signal X.

An example of a typical communications signal is shown in FIG. 4. In this figure there is a strong undesired adjacent channel signal B which is to be rejected in order to accept and analog to digital convert the desired information signal A centered at $\omega_0$. The prior art system does not adequately reject the undesired adjacent channel signal B, but rather leaves this task to the subsequent decimation filter. Because of this non-rejection of adjacent channel signal B, the dynamic range of the signals in such prior art sigma delta converters are determined in large part by the undesirable adjacent channel signal B and not solely by the desired information signal A. Thus accuracy of the conversion from analog to digital of desired information signal A is dependent on the difference in levels between it and undesired adjacent channel signal B. This can be seen in FIG. 5, which plots the signal to noise ratio of an analog to digital conversion against the signal strength of the input signal to an oversampled converter. As shown in the example of FIG. 5, amplification is set such that the amplified input signal has a signal amplitude of 2.5 volts. In the prior art example of FIG. 4, in which there is a large adjacent channel signal, the sum of the desired information signal A and the undesired adjacent channel signal B is amplified to 2.5 volts. This necessarily means that the amplitude of the amplified desired information signal A alone is much less than 2.5 volts. In the example of FIG. 5, if the amplified desired information signal A has an amplitude of 25 mv, its signal to noise ratio is only 20 dB—significantly less than the 85 dB signal to noise ratio of the composite input signal X having such components A and B.

Another problem in the prior art is the loss of dynamic range in the later stages of a series of cascaded converters. For the same reasons as stated above the dynamic range of the signal is critical to maintaining a high accuracy conversion. Ping's design requires attenuation of the signal entering the second stage, signal X2 in Ping's paper, by a factor of four before it enters the second stage of the converter. This decreases the possible accuracy of the converter.

Furthermore, Ping's prior art system utilizes the bi-quad formulation for implementation of transfer functions H1 and H2. This filter formation is widely known to have difficulties with coefficient sensitivity and dynamic range of intermediate nodes.

SUMMARY

The key elements of a receiver design are its physical size, its power consumption, and its cost. In the past, integration onto silicon of major portions of the portable terminal have accomplished these goals. The present invention allows for the further integration of the receiver over prior art implementations. The present invention simplifies the construction of direct conversion receivers for a variety of personal communication systems.

In order to incorporate multiple protocols the converter must be capable of operating with a set of predetermined center frequencies ($\omega_0$) and bandwidths (BW). In addition, each protocol requires a different level of bit precision for the converted signal.

The optimal converter design allows the highest signal to noise conversion to occur for the desired information signal. Thus the converter must allocate the highest gain to the desired information signals to be converted. In accordance with the teachings of this invention, selectivity in the early stages of the sigma delta converter rejects adjacent channel signals and thereby allows greater dynamic range for the desired input signals.

A novel bandpass sigma delta converter is taught which is suitable for use with signals having multiple protocols. In a first stage, an aliased input signal is applied to two filters having desired and preferably programmable filter characteristics which provide selectivity to the input signal. A third filter is utilized having a programmable center frequency and which receives as an input signal the sum of the filtered input signal plus the quantization noise of the first stage. This provides a first intermediate output signal of the desired selectivity. The quantization noise of the first stage is also applied to a second filter stage which serves to provide a second intermediate output signal having a first component related to the quantization noise of the first stage, and a second component which is the shaped quantization noise of the second stage. The first and second intermediate output signals from the first and second stages are combined in order to provide a desired output signal in which the original input signal has been filtered to provide a desired selectivity and converted to a digital signal while the quantization noise of the first stage has been cancelled, and the quantization noise of the second stage has been shaped by a desired function and converted to a digital signal independent of the input signal shaping.

DETAILED DESCRIPTION

Figure 1:
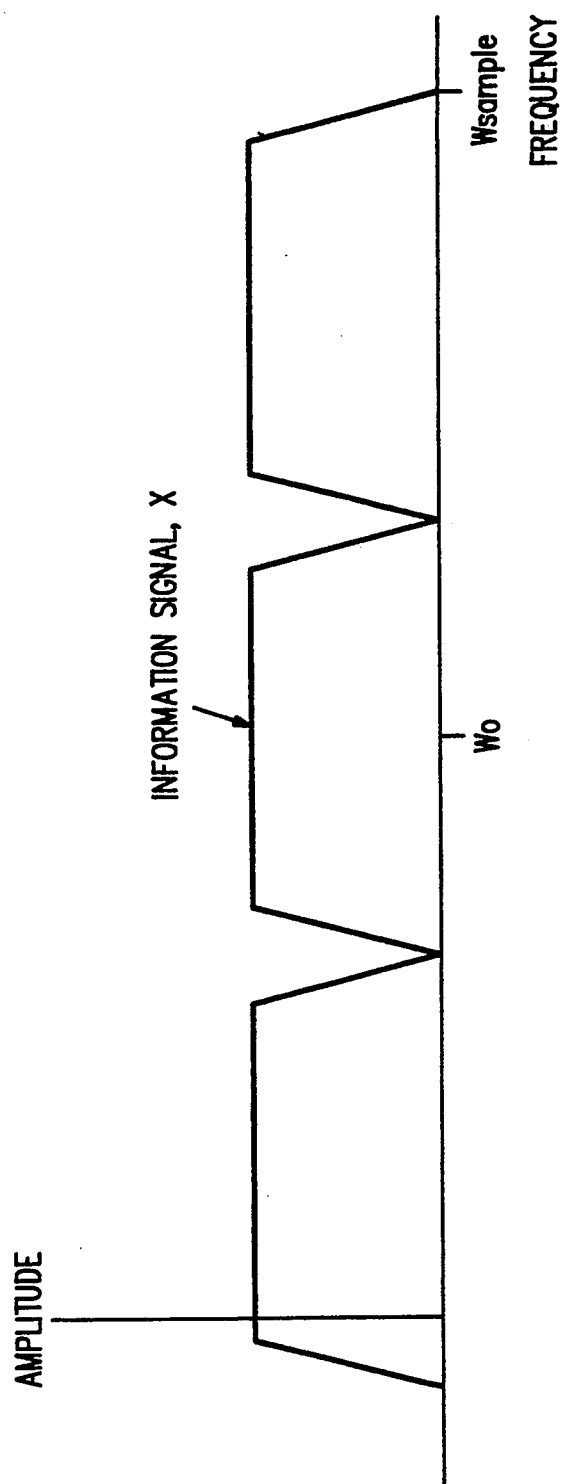
FIG. 1 is a diagram depicting an aliased information signal.
Figure 2:
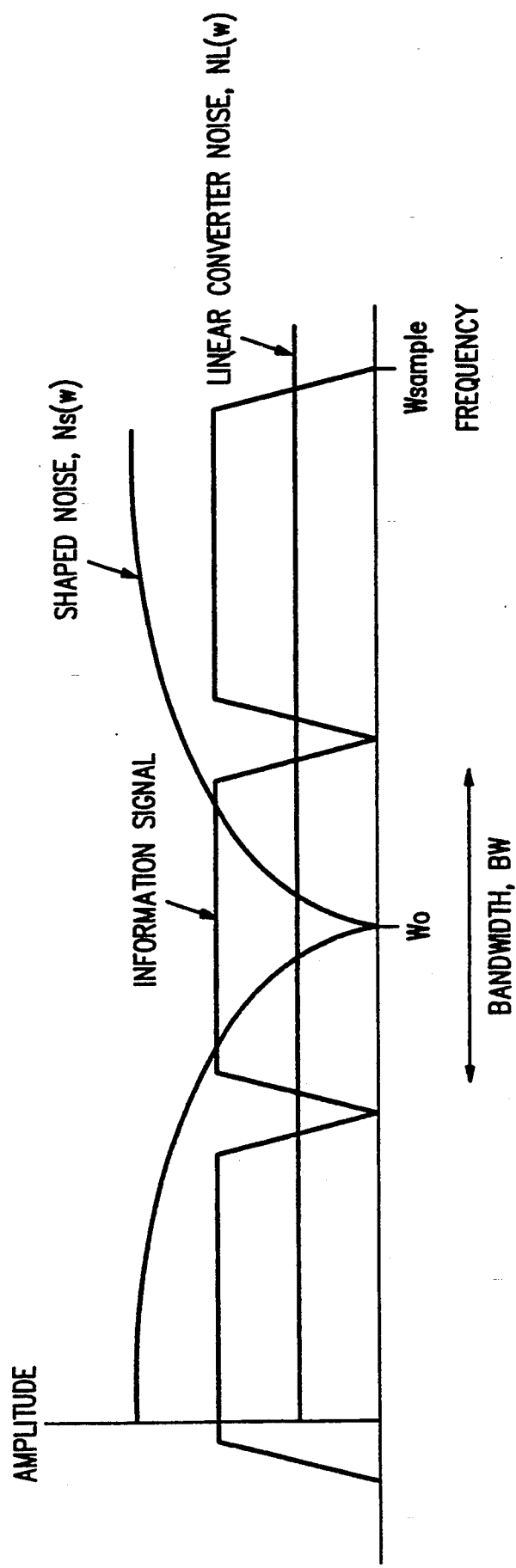
FIG. 2 is a diagram depicting the aliased information signal together with a depiction of quantization noise achieved when utilizing a linear converter or an oversampled converter.
Figure 3:
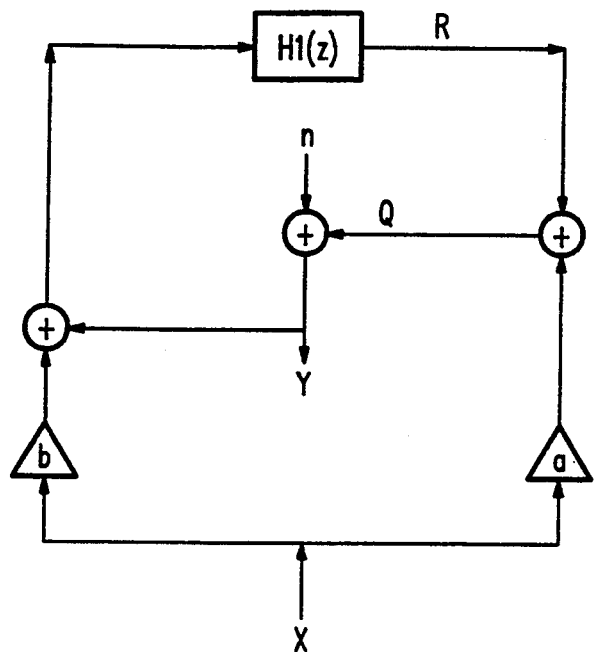
FIG. 3 is a block diagram of a prior art bandpass sigma delta converter.
Figure 5:
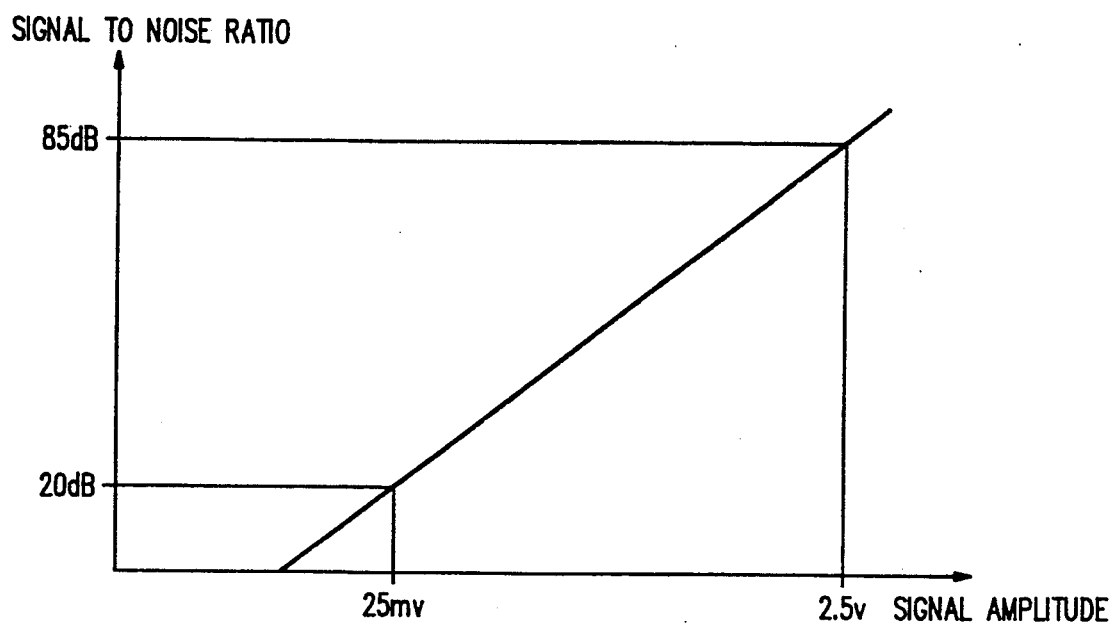
FIG. 5 is graph depicting signal to noise ratio vs. signal amplitude in a sigma delta converter.
Figure 4:
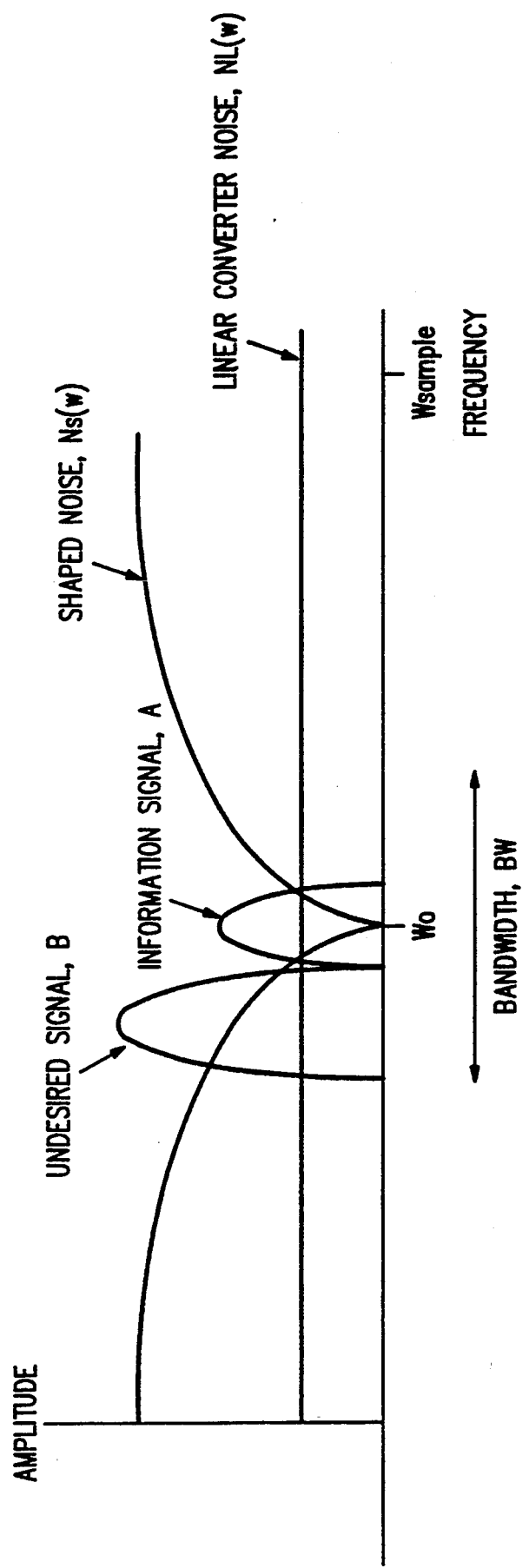
FIG. 4 is a block diagram of one embodiment of a sigma delta converter constructed in accordance with the teachings of this invention.
Figure 6:
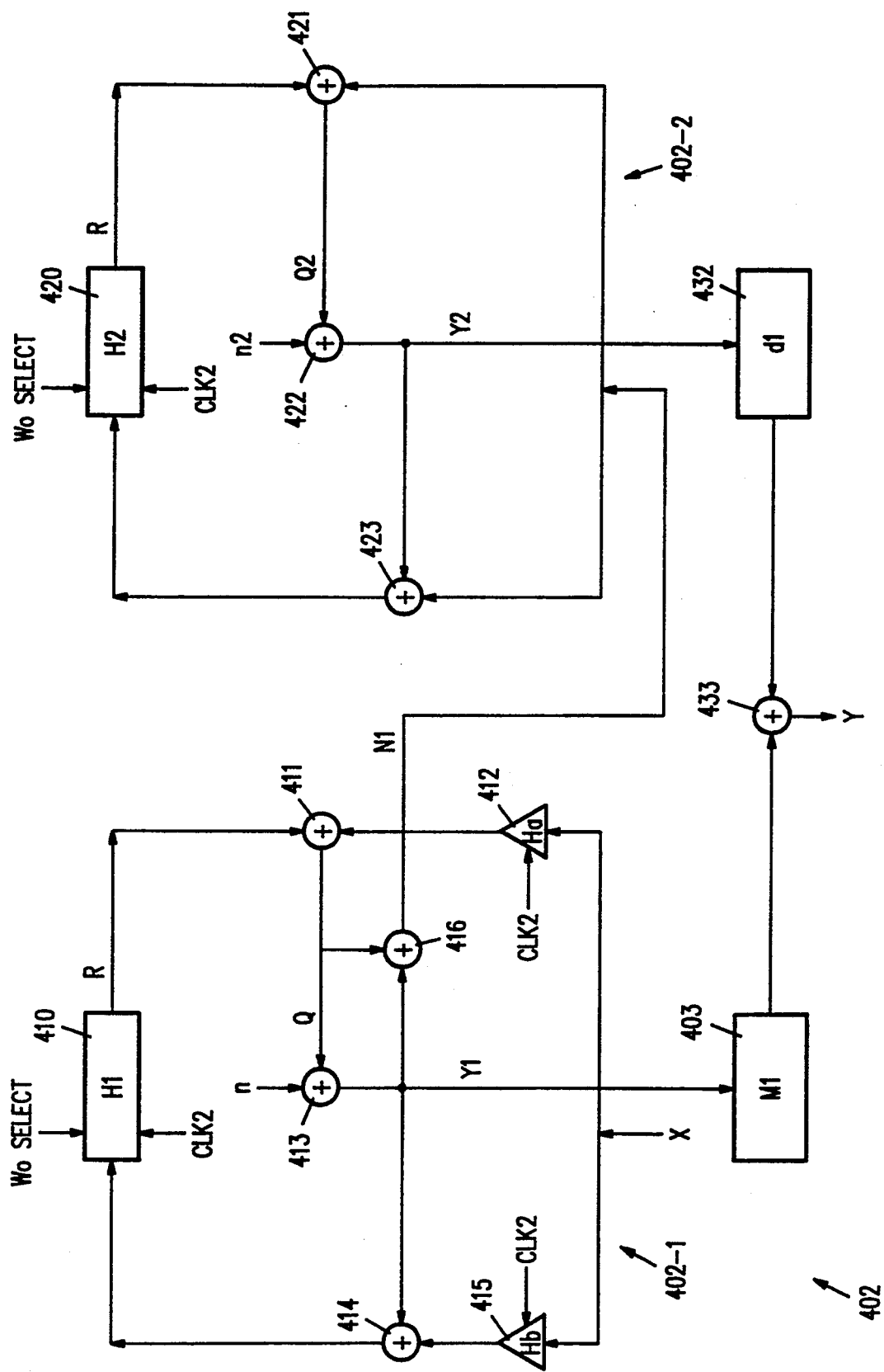
FIG. 6 is a block diagram depicting one embodiment of a novel sigma delta converter constructed in accordance with the teachings of this invention.

FIG. 6 shows a block diagram of one embodiment of a sigma delta converter constructed in accordance with the teachings of the present invention. Input signal X is as shown in the example of FIG. 1, i.e. a set of aliased copies of a composite input signal shown generally in FIG. 4 having a desired information signal A and an undesired adjacent channel signal B. This aliased input signal X is applied simultaneously to both filters 412 and 415 of first stage 402-1, having transfer functions $H_a$ and $H_b$, respectively. Transfer functions $H_a$ and $H_b$ serve to implement selectivity to input signal X, in order to select the desired information signal A and reject undesired adjacent channel signals such as adjacent channel signal B. Filters 412 and 415 also receive clock signal CLK2, which is provided by a crystal controlled clock circuit (not shown), for example.

The output signals from filters 412 and 415 are applied to adders 411 and 414, respectively. Filter 410, having transfer function $H_1$, receives a $\omega_0$ select signal defining a desired center frequency, i.e., which one of the aliased copies of the composite input signals is to be utilized. Filter 410 also receives the CLK2 clock signal, and receives as its input signal the output signal from adder 414. The output signal from filter 410 is applied as one of the inputs to adder 411. The output signal from adder 411 is applied to digitizer 413. The inherent quantization noise created by digitizer 413 creates quantization noise $N_1$ which is shaped by filter 410 having transfer function $H(z)$. The output signal from digitizer 413 serves as a second input to adder 414.

Output signal Y, is given by:

$$Y_1 = \left[ \frac{1}{(1 - H_1)} \right] N_1 + \left[ \frac{(H_a + H_b H_1)}{(1 - H_1)} \right] X$$

Transfer functions $H_a$ and $H_b$ can be implemented to filter a desired one of the aliased copies contained within input signal X. For example, if $H_a = H_b = 1$, input signal X is bandpass filtered by the function $$\frac{1 + H_1}{1 - H_1}$$

Of interest, the shaping of the quantization noise $N_1$ introduced by the conversion operation of first stage 402-1 is independent of transfer functions $H_a$ and $H_b$. Thus the transfer function of the decimation filter (not shown) which follows sigma delta converter 402 may be made independent of the choice of transfer functions $H_a$ and $H_b$ and thus can be constructed without regard to the selectivity, as determined by transfer functions $H_a$ and $H_b$ of first stage 402-1 of sigma delta converter 402. This simplifies the construction of the decimator, and allows the selectivity provided by first stage 402-1 of sigma delta converter 402 to be easily changed without affecting the decimator, allowing for simple alterations for operation in receiving different protocols.

Adder 416 receives as its positive input the output signal $Y_1$ from adder 413 and its minus signal output signal $Q_1$ from adder 411. This provides an intermediate output signal $N_1$, the quantization noise of first stage 402-1, which is applied as the input signal to second stage 402-2 of sigma delta converter 402. The variance of this quantization noise signal $N_1$ is less than that of signal R, which is used by the prior art of Ping as the input signal to a second stage. The reduced variance of quantization noise signal $N_1$ as compared with signal R allows for more accurate setting of the gain of second stage 402-2 of sigma delta converter 402 for a variety of input signal characteristics.

To achieve a high level of stability and low sensitivity to component variations, transfer function H1 is preferably implemented, in one embodiment, as a ladder filter. Ladder filter switched capacitor filters are well known in the art and are described, for example, in "Design Techniques for MOS Switched Capacitor Ladder Filters," Jacobs, Allstot, Brodersen, Gray, IEEE transactions on Circuits and Systems, vol. CAS-25, number 12, pp. 1014–1021, Dec. 1978.

The intermediate output signal from first stage 402-1 is applied to one input of adder 423 of second stage 402-2. Adder 423 provides its output signal to filter 420 having a transfer function $H_2$. Filter 420 also receives the $\omega_0$ select signal, as well as the CLK2 clock signal. The output signal from filter 420 is applied to adder 421, which receives as its other input the intermediate output signal from first stage 402-1. The output signal $Q_2$ of adder 421 is applied to one input of digitizer 422, which receives as its other input signal $N_2$, the inherent quantization noise of second stage 402-2. The output signal of digitizer 422 serves as intermediate output signal $Y_2$, which is also applied as the second input signal to adder 423.

Output signal $Y_2$ of second stage 402-2 is given by:

$$Y_2 = -N_1 + \left[\frac{1}{1-H_2}\right]N_2$$

This allows quantization noise $N_1$ of the first stage 402-1 of sigma delta converter 402 to pass directly through to output $Y_2$ while shaping the quantization noise $N_2$ of second stage 402-2 of sigma delta converter 402 in accordance with transfer function $H_2(z)$. Signal $N_1$ from sigma delta modulator 402-2 is used to cancel the effect of the shaped noise signal content of signal $Y_1$. This is accomplished in elements 432 and 433. The advantage of having quantization noise $N_2$ of second stage 402-2 shaped by transfer function $H_2(z)$ is that the noise component in final output signal Y will thus contain higher order shaping than would otherwise be obtained using only a single stage 402-1.

Digital intermediate output signals $Y_1$ and $Y_2$ from first and second stages 402-1 and 402-2, respectively, are now combined to form the desired output signal Y. This combination is performed, for example, using digital filters 431 and 432 having transfer functions $m_1$, and $d_1$, respectively, whose output signals are added by adder 433 to provide output signal Y. Output signal Y is given as:

$$Y = m_1 Y_1 + d_1 Y_2$$

which yields $$Y = m_1(\omega_{ab}X + \omega_1 N_1) + d_1(-N_1 + \omega_2 N_2)$$

where $$\omega_1 = \frac{1}{(1-H_1)}$$

-continued $$\omega_2 = \frac{1}{(1-H_2)}$$

$$\omega_{ab} = \frac{(H_a + H_1 H_b)}{(1-H_1)}$$

Rearranging the terms, $$Y = m_1 \omega_{ab} X + m_1 \omega_1 n_1 + d_1(-N_1) + d_1 \omega_2 N_2$$

Filter d1 is implemented as a digital representation of $\omega_1$ such that $d_1 \approx \omega_1$, yielding:

$$Y = [m_1 \omega_{ab} X + \omega_1 \omega_2 N_2] + [m_1 \omega_1 N_1 - \omega_1 N_1]$$

Filter m1 is implemented as a pure delay to match the inherent delays in filter d1. This allows the $N_1$ noise terms to cancel, yielding:

$$Y = m_1 \omega_{ab} X + \omega_1 \omega_2 N_2$$

Thus the original output signal X has been filtered and converted to a digital signal while quantization noise $N_2$ has been shaped by the function $\omega_1 \omega_2$ and converted to a digital signal independent of the input signal shaping (selectivity)

Since the majority of the selectivity of the receiver is implemented in the subsequent decimator stage (not shown but as described, for example, in the aforementioned copending U.S. patent application No. 07/936,361, the filtering of input signal X before its conversion to a digital signal does not have to be high Q as in other traditional receivers. This is advantageous since high Q filters which are implemented with analog circuits are subject to poor power supply rejection ratios due to the high voltage sensitivity of internal nodes within the filter, and are difficult to adjust.

The adaptation of center frequency $\omega_0$ for different protocols is accomplished by a combination of adjusting the sampling rate and filter coefficients of sigma delta converter 402. The bandwidth of the shaping of quantization noise $N_1$ and $N_2$ of stages 402-1 and 402-2 is determined by the coefficients of filters $H_1$ and $H_2$, respectively. These filters can be easily implemented as switched capacitor filters, in which case the capacitor ratios determine the filter coefficients and set the Q of the filters. The signal to noise ratio of the resultant output signal Y is determined by the oversampling ratio, i.e. the ratio between $\omega_0$ and $\omega_s$, the frequency of oversampling clock CLK2), the order of the sigma delta converter, and the precision of the subsequent decimation filter (not shown).

In one embodiment, digitizers 413 and 422 are implemented as comparators having an output signal which is determined by comparison of its input signal with a fixed voltage reference. The inaccuracy of this comparison is known as the inherent quantization noise of the stage utilizing the comparator, referred to above as inherent quantization noise $N_1$ and $N_2$ of stages 402-1 and 402-2, respectively.

The embodiment depicted in FIG. 6 is of a single stage sigma delta converter providing a second order filtering function. It will be appreciated by those of ordinary skill in the art in light of the teachings of this invention that higher order filtering may be accomplished as well, for example a two stage sigma delta converter constructed in accordance with the teachings of this invention will provide a fourth order filtering function, and so on.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed:

1. A bandpass sigma delta converter comprising: an input port for receiving an input signal comprising a plurality of aliased copies of a desired information signal;
   a first stage having an inherent quantization noise, comprising:
      an input port coupled to said input port of said bandpass sigma delta converter in order to receive said input signal;
      an output port;
      a first filter network having an input port coupled to said input port of said first stage and an output port coupled to said output port of said first stage for providing a desired selectivity to said input signal in order to cause said converter to provide on said output port of said first stage a first intermediate output signal comprising a selected one of said aliased copies of said desired information signal;
      a second filter network coupled to said input port of said first stage and to receive said intermediate output signal for providing a component of said first intermediate output signal comprising a shaped value of said inherent quantization noise of said first stage; and
      a noise output terminal for providing a noise output signal comprising said inherent quantization noise of said first stage;
   a second stage having an inherent quantization noise, comprising:
      an input port coupled to said noise output port of said first stage;
      an output port; and
      a filter network having an input port coupled to said input port of said second stage and an output port coupled to said output port of said second stage, and providing on said output port of said second stage a second intermediate output signal comprising a first component comprising said inherent quantization noise of said first stage and a second component comprising a shaped value of said inherent quantization noise of said second stage; and
   a third stage comprising:
      a first input port coupled to said output port of said first stage;
      a second input port coupled to said output port of said second stage; and
      an output port for providing a final output signal comprising a first component of said selected one of said plurality of aliased copies of said information signal with a desired selectivity to reject adjacent channel signals, and a second component of said shaped inherent quantization noise of said second stage.

2. A converter as in claim 1 wherein said final output signal is substantially free from said inherent quantization noise of said first stage.

3. A converter as in claim 1 wherein said first filter network of said first stage further comprises a frequency select port for receiving a center frequency select signal for establishing a filter center frequency in response thereto.

4. A converter as in claim 1 wherein said filter network of said second stage further comprises a frequency select port for receiving a center frequency select signal for establishing a filter center frequency in response thereto.

5. A converter as in claim 1 wherein said first and second filter networks together comprise:
   a first input filter having an input port coupled to said input port of said first stage, and having an output port;
   a second input filter having an input port coupled to said input port of said first stage, and having an output port;
   a third filter network having an input port and an output port;
   a first adder having a first input port coupled to said output port of said first input filter, a second input port, and an output port coupled to said input port of said third filter network;
   a second adder having a first input port coupled to said output port of said second input filter, a second input port coupled to said output port of said third filter network, and an output port;
   a digitizer having an inherent quantization noise, said digitizer having an input lead coupled to said output port of said second adder and an output port coupled to said second input port of said first adder and to said output port of said first stage; and
   a third adder having an addition input coupled to said output port of said digitizer, a subtraction input coupled to said output port of said second adder, and an output port coupled to said noise output port of said first stage.

6. A converter as in claim 5 wherein said second stage further comprises:
   a first adder having a first input coupled to said input port of said second stage, a second input coupled to said output port of said second stage, and an output port coupled to said input port of said filter network of said second stage;
   a second adder having a first input coupled to said output port of said filter network of said second stage, a second input coupled to said input port of said second stage; and an output port; and
   a digitizer having an input lead coupled to said output port of said second adder and an output port coupled to said output port of said second stage.

7. A bandpass sigma delta converter having an inherent quantization noise, comprising:
   an input port for receiving an input signal comprising a plurality of aliased copies of a desired information signal;
   an output port;
   a first filter network having an input port coupled to said input port of said converter and an output port coupled to said output port of said converter for providing a desired selectivity to said input signal in order to cause said converter to provide on said output port of said converter an output signal comprising a selected one of said aliased copies of said desired information signal;

a second filter network having a first input port coupled to said input port of said converter, a second input port coupled to receive said output signal, and an output port for providing a component of said signal comprising a shaped value of said inherent quantization noise; and a noise output circuit including a noise output port, said noise output circuit coupled to receive signals from said first and second filter networks and for providing in response thereto a noise output signal comprising said inherent quantization noise.

8. A converter as in claim 7 wherein said first filter network comprises a frequency select port for receiving a center frequency select signal for establishing a filter center frequency in response thereto.

9. A converter as in claim 7 wherein said first filter network comprises:

a first input filter having an input port coupled to said input port of said converter and having an output port;

a second input filter having an input port coupled to said input port of said converter and having an output port;

a first adder having a first input port coupled to said output port of said first input filter, a second input port, and an output port coupled to said first input port of said second filter network;

a second adder having a first input coupled to said output port of said second input filter, a second input port coupled to said output port of said second filter network, and an output port;

a digitizer having an inherent quantization noise forming at least part of said inherent quantization noise of said converter, said digitizer having a first input lead coupled to said output port of said second adder and an output port coupled to said second input port of said first adder and to said output port; and a third adder having an addition input coupled to said output port of said digitizer, a subtraction input coupled to said output port of said second adder, and an output port coupled to said noise output port.

10. A converter as in claim 5 wherein said digitizer comprises a comparator having a first input lead coupled to said input lead of said digitizer, a second input lead coupled to a reference voltage, and an output lead coupled to said output port of said digitizer.

11. A converter as in claim 6 wherein said digitizer comprises a comparator having a first input lead coupled to said input lead of said digitizer, a second input lead coupled to a reference voltage, and an output lead coupled to said output port of said digitizer.

12. A converter as in claim 9 wherein said digitizer comprises a comparator having a first input lead coupled to said input lead of said digitizer, a second input lead coupled to a reference voltage, and an output lead coupled to said output port of said digitizer.

13. A converter as in claim 7 wherein said output signal is substantially free from said inherent quantization noise of said converter.

14. A bandpass sigma delta converter comprising:

an input port for receiving an input signal comprising a plurality of aliased copies of a desired information signal;

an output port;

a plurality of first stages, each first stage having an inherent quantization noise, each first stage comprising:

an input port;

an output port;

a first filter network having an input port coupled to said input port of said first state, and an output port for providing a desired selectivity to a signal being processed by said first filter network in order to cause said first stage to provide on said output port of said first stage a signal of a selected bandwidth;

a second filter network coupled to said input port of said first stage and to receive said signal on said output port of said first stage for providing a component of said signal comprising a shaped value of said inherent quantization noise of said first stage; and a noise output circuit including a noise output port, said noise output circuit coupled to receive signals from said first and second filter networks and for providing in response thereto a noise output signal comprising said inherent quantization noise;

a second stage having an inherent quantization noise, comprising:

an input port;

an output port; and a filter network having an input port coupled to said input port of said second stage and an output port coupled to said output port of said second stage, and providing on said output port of said second stage an second intermediate output signal comprising a first component comprising said inherent quantization noise of said first stage and a second component comprising a shaped value of said inherent quantization noise of said second stage; and a third stage comprising:

a first set of input ports coupled to one or more of said output ports of said plurality of first stages;

a second input port coupled to said output port of said second stage; and an output port coupled to said Output port of said bandpass sigma delta converter for providing a final output signal comprising a first component of said selected one of said plurality of aliased copies of said information signal with a desired selectivity to reject adjacent channel signals, and a second component of said shaped inherent quantization noise of said second stage, said input port of a first one of said plurality of first stages being coupled to said input port of said converter, said noise output port of a last one of said plurality of first stages being coupled to said input port of said second stage, and said input port of said first stages other than said first one of said plurality of first stages being coupled to the noise output port of a preceding one of said plurality of first stages.

15. A converter as in claim 14 wherein said first filter network of at least one of said first stages comprises means for receiving a center frequency select signal and means for providing a filter center frequency in response thereto.

16. A converter as in claim 14 wherein said first filter network of one or more of said first stages each comprises:
- a first input filter having an input port coupled to said input port of said first stage and having an output port;
- a second input filter having an input port coupled to said input port of said first stage and having an output port;
- a first adder having a first input port coupled to said output port of said first input filter, a second input port, and an output port coupled to said input port of said second filter network;
- a second adder having a first input port coupled to said output port of said second input filter, a second input port coupled to said output port of said second filter network, and an output port;
- a digitizer having an inherent quantization noise forming at least part of said inherent quantization noise of said first stage, said digitizer having a first input lead coupled to said output port of said second adder, and an output port coupled to said second input of said first adder and to said output port of said first stage; and
- a third adder having an addition input coupled to said output port of said digitizer, a subtraction input coupled to said output port of said second adder, and an output port coupled to said noise output port.

* * * * *